(12) United States Patent
Hoel et al.

(10) Patent No.: US 11,855,655 B2
(45) Date of Patent: Dec. 26, 2023

(54) SERIAL COMMUNICATIONS MODULE WITH CRC

(71) Applicant: Texas Instruments Incorporated, Dallas, TX (US)

(72) Inventors: Robin Osa Hoel, Oslo (NO); Anand Kumar G, Bengaluru (IN); Dhivya Ravichandran, Karaikal (IN); Aniruddha Periyapatna Nagendra, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/710,906

(22) Filed: Mar. 31, 2022

(65) Prior Publication Data
US 2023/0132069 A1 Apr. 27, 2023

(30) Foreign Application Priority Data
Sep. 28, 2021 (IN) .............................. 202141043828

(51) Int. Cl.
*H03M 13/09* (2006.01)
*H03M 13/00* (2006.01)
*G06F 13/40* (2006.01)

(52) U.S. Cl.
CPC .......... *H03M 13/091* (2013.01); *G06F 13/40* (2013.01); *H03M 13/611* (2013.01)

(58) Field of Classification Search
CPC .... H03M 13/091; H03M 13/611; G06F 13/40
See application file for complete search history.

(56) References Cited

U.S. PATENT DOCUMENTS

| | | | | | |
|---|---|---|---|---|---|
| 5,802,080 | A | * | 9/1998 | Westby | .................. G06F 11/10 714/752 |
| 6,279,057 | B1 | * | 8/2001 | Westby | .................. H04L 1/246 710/52 |
| 6,456,875 | B1 | * | 9/2002 | Wilkinson | .......... H03M 13/091 607/31 |
| 6,836,869 | B1 | * | 12/2004 | Wyland | ............... H03M 13/158 714/784 |
| 2002/0174399 | A1 | * | 11/2002 | Keller | ................. H03M 13/617 714/779 |
| 2004/0015691 | A1 | * | 1/2004 | Collette | .................. H04L 12/56 713/161 |

(Continued)

*Primary Examiner* — Steve N Nguyen
(74) *Attorney, Agent, or Firm* — Mandy Barsilai Fernandez; Frank D. Cimino

(57) ABSTRACT

A circuit with an interface, a transmit data register coupled to the interface, a storage device coupled to the transmit data register and including a plurality of storage locations, each storage location adapted to store a data unit, and a serial register coupled between the storage device and an output. The circuit also includes a CRC generation circuit having an input coupled between an output of the transmit data register and the storage device. The CRC generation circuit includes a first CRC generation block for providing a CRC in response to an X-bit data unit and an X-bit polynomial and a second CRC generation block with a collective X-bit input for providing a CRC in response to an X-bit data unit and a 2X-bit polynomial in a single clock cycle and a 2X-bit data unit and a 2X-bit polynomial in two clock cycles.

19 Claims, 6 Drawing Sheets

(56) References Cited

U.S. PATENT DOCUMENTS

| | | | | |
|---|---|---|---|---|
| 2004/0098655 A1* | 5/2004 | Sharma | ............... | H03M 13/091 |
| | | | | 714/758 |
| 2009/0313533 A1* | 12/2009 | Bains | .................. | G06F 11/1004 |
| | | | | 714/E11.032 |
| 2011/0191647 A1* | 8/2011 | Miller | ................... | H04L 1/1607 |
| | | | | 714/748 |

* cited by examiner

SERIAL COMMUNICATIONS MODULE WITH CRC

CROSS-REFERENCE TO RELATED APPLICATION

This application claims the benefit of and priority to India patent Application No. 202141043828, filed Sep. 28, 2021, which is hereby fully incorporated herein by reference.

BACKGROUND

The examples described relate to electronic circuits and more particularly to a communication circuit that implements cyclic redundancy check (CRC) to verify communicated data.

Serial data may be communicated by various different types of communication modules, including as examples, a serial peripheral interface (SPI) module, a universal asynchronous receiver-transmitter (UART), and an I2C (inter-integrated circuit) module. Often these serial communication modules include a CRC determination block, which provides a CRC value for a block of serial data. CRC typically involves polynomial operations, such as division, based on the data block values. The CRC value is a type of checksum for that data block, where the checksum is communicated after the data block so that a receiver of the data block and CRC value can detect error(s) that may occur in transmission of the data block. The receiver determines its own checksum based on the received data block and compares the self-determined CRC value to the received CRC value, whereupon a match indicates the received data block is valid, while to the contrary a mismatch indicates one or more errors in values received in the data block.

Some current CRC implementations attempt to address various considerations. For example, a same communication module may need to calculate a CRC value for different sizes of data units. As another example, a same communication module may need to calculate a CRC value using different sized polynomials. Typical communication modules seeking to accommodate these considerations may have increased numbers of logic gates and/or numbers of clock cycles required to compute the CRC. These approaches are generally undesirable, in that the former increases size, cost, and potentially power consumption, and the latter increases latency.

Examples are provided in this document that may improve on various of the above considerations as well as other concepts, as further detailed below.

SUMMARY

In one example, there is a circuit with an interface, a transmit data register coupled to the interface, a storage device coupled to the transmit data register and including a plurality of storage locations, each storage location adapted to store a data unit, and a serial register coupled between the storage device and an output. The circuit also includes a CRC generation circuit having an input coupled between an output of the transmit data register and the storage device. The CRC generation circuit includes a first CRC generation block for providing a CRC in response to an X-bit data unit and an X-bit polynomial and a second CRC generation block with a collective X-bit input for providing a CRC in response to an X-bit data unit and a 2X-bit polynomial in a single clock cycle and a 2X-bit data unit and a 2X-bit polynomial in two clock cycles.

Other aspects are also disclosed and claimed.

DETAILED DESCRIPTION

Figure 1:
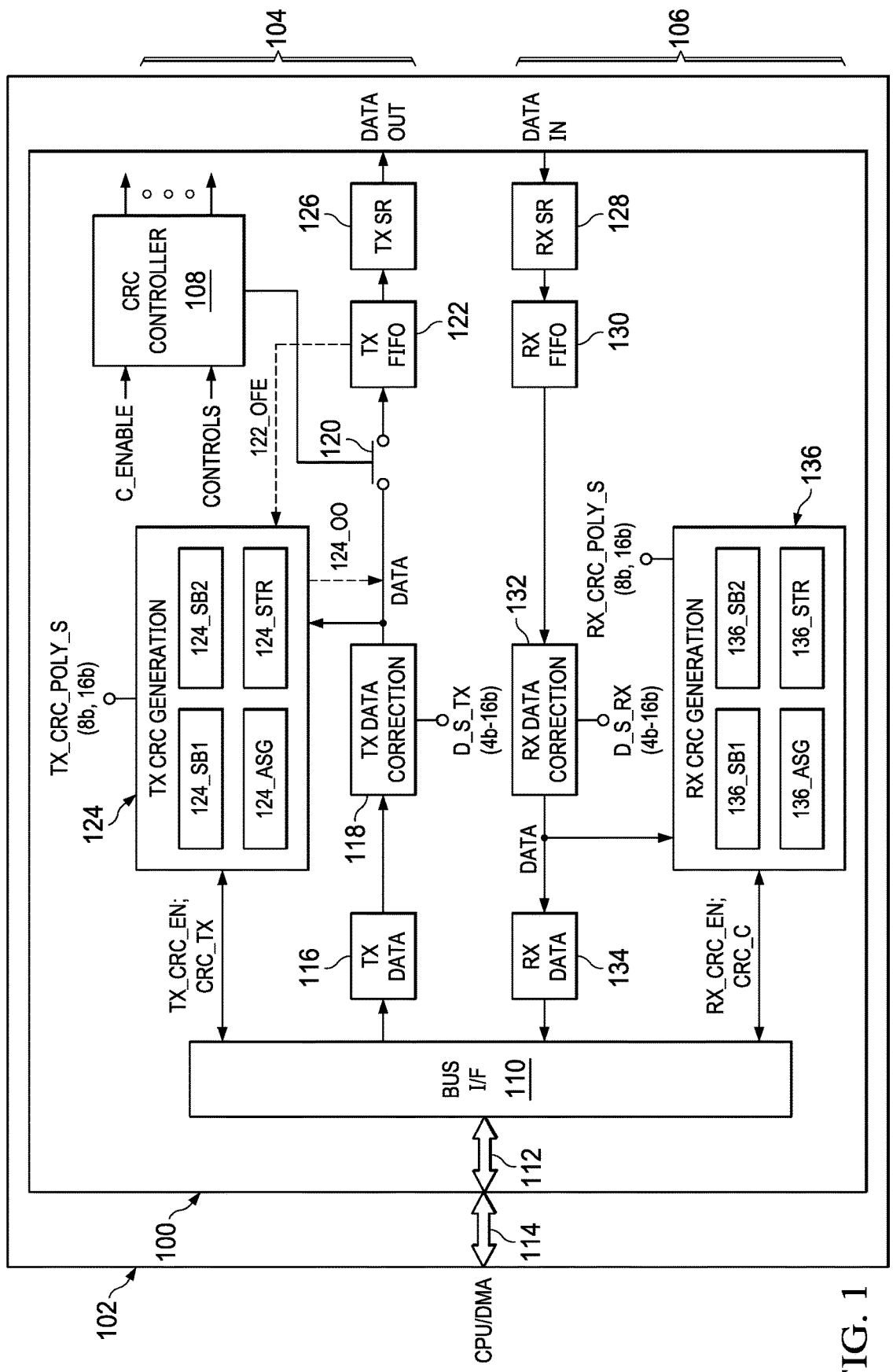
FIG. 1 illustrates an example of a serial communication module.

FIG. 1 illustrates an example of a serial communication module (SCM) 100, as may be implemented as part of a transceiver in an integrated circuit (IC) 102. The IC 102 may include multiple instances of the SCM 100, but for brevity only one is shown and discussed. The SCM 100 may be implemented in various forms, for example in connection with SPI, I2C, or a UART. For reference, the SCM includes a transmit (TX) path 104 and a receive (RX) path 106, each of which includes CRC-related structure and functionality. The SCM 100 also includes a CRC controller 108, for example implemented as a hardware state machine. The CRC controller 108 receives a controller enable (C_ENABLE) signal which when asserted causes a CRC-related operational response, for either writing or reading CRC-appended data. Generally, the CRC controller 108 is shown to have a set of control inputs and a number of outputs, intended to suggest respective signals, some described below, for receiving signals from, and controlling various portions of, the SCM 100. Both the TX path 104 and the RX path 106 communicate with a bus interface (I/F) 110, which in an example communicates multiple bits in parallel, where the TX path 104 ultimately outputs a DATA OUT sequence, based on data received from the bus I/F 110, external to the SCM 100 (e.g., via a pin or the like), while the RX path 106 receives a DATA IN sequence from an external source relative to the SCM 100 (again via a pin or the like), and then that data is processed with the results provided to the bus I/F 110. The bus I/F 110 bidirectionally couples to a first bus 112. While not shown, other items in the SCM 100 may communicate with the first bus 112, and the first bus 112 also communicates with a second bus 114 in the IC 102 and items in the IC 102 connected to the second bus 114. Either on the IC 102, or external from the IC 102, a central processing unit (CPU) or a direct memory access (DMA) controller, which may be part of the CPU, can communicate with the first and second buses 112 and 114. For example, assume that each of the first and second buses 112 and 114 communicates either 8-bit or 16-bit data values. Further, each of the items described in connection in the SCM 100 may be constructed by a combination of logic gates and other readily ascertainable circuitry or hardware, given the further descriptions of those items in this document.

The TX path 104 includes various aspects for transmitting a data sequence, and a corresponding TX CRC value for the data sequence, in response to data provided from the first bus 112. Looking generally from left to right in FIG. 1 at the TX path 104, a TX DATA register 116 is coupled to receive multi-bit input data from the bus I/F 110 and to output data to a TX data correction block 118. The TX DATA register 116 is sized to a predetermined maximum possible data input size of M bits, for example with M=16 bits. The TX data correction block 118 has a data size D_S_TX control input, which also may be provided as a control input to the CRC controller 108. D_S_TX specifies a number N of the least significant of the M bits (where for example 4≤N≤16) that will be subsequently transmitted in the DATA OUT, and relatedly the TX data correction block 118 alters the remaining M-N most significant bits for the CRC value determination, for example by replacing those M-N MSBs with zeroes. The TX data correction block 118 is coupled to output the data, potentially altered by the TX data correction block 118, to a switch 120. The switch 120 is controlled by the CRC controller 108 to close, for example when C_ENABLE is asserted, so that in that state the data is connected from the TX data correction block 118, through the switch 120, to a TX first-in first-out storage device (FIFO) 122. The TX FIFO 122 may be constructed to a form generally known in the art, so as to include a number of storage locations and appropriate control, such as an address pointer. The TX FIFO 122 number of storage locations is relatively small and selected to accommodate data and CRC value sizes based on the anticipated data and communication speed, so as to avoid lag as data is passing through the TX FIFO 122. For example, the TX FIFO 122 can include a total of 8 storage locations, each the same width as the TX DATA register 116 (such as 16-bits wide). Apart from the connection to the switch 120, the data output by the TX data correction block 118 is also connected to a TX CRC generation block 124. The TX CRC generation block 124 is bidirectionally coupled to the bus I/F 110, allowing data and control to be exchanged between the two, for example an enabling control TX_CRC_EN can be coupled from the bus I/F 110 to the TX CRC generation block 124 to enable generation of a transmit CRC value indicated as CRC_TX, and the bus I/F 110 can read that CRC_TX. The TX CRC generation block 124 has a CRC polynomial select control (TX_CRC_POLY_S), in response to which the CRC generation block 124 selects the size of the appropriate CRC polynomial, and using that polynomial with data from the TX data correction block 118 the TX CRC generation block 124 generates the CRC_TX. In the example, TX_CRC_POLY_S may be a 1-bit control, indicating in a first binary state a selection of an 8-bit polynomial and in a second binary state a selection of a 16-bit polynomial. As detailed later, each of these two different polynomial sizes may be processed within the TX CRC generation block 124 by a respective one of a first CRC sub-block 124_SB1 using the 8-bit polynomial or a second CRC sub-block 124_SB2 using the 16-bit polynomial. The TX CRC generation block 124 also includes a state register 124_STR that stores a value that can be changed by an external source, such as the CPU. For example, the value is set to a first state when the TX CRC generation block 124 is to begin reading data and generating the CRC_TX and the value is set to a second state when the completed CRC_TX is to be read from the CRC generation block 124. The TX CRC generation block 124 also includes an auto-seed generator 124_ASG, such that when the state register 124_STR is written or read, and provided the TX CRC generation block 124 does not already have a CRC seed available for CRC determination, then the auto-seed generator 124_ASG provides a seed in response to the state register 124_STR write/read. The particular seed generated may be according to the appropriate protocol and depending on the polynomial size indicated by TX_CRC_POLY_S; for example, if the SCM 100 is implemented in a Consultative Committee for International Telephony and Telegraphy (CCITT, or more recently, the International Telegraph Union (ITU)) device, then the auto-seed generator 124_ASG provides a seed value of 0xFF for an 8-bit CRC polynomial or 0xFFFF for a 16-bit CRC polynomial. Once the CRC_TX is determined by the TX CRC generation block 124, the bidirectional coupling between the TX CRC generation block 124 and the bus I/F 110 permits the CRC_TX to be read from the bus I/F 110, for example under request of a master (e.g., CPU or DMA), after which that CRC_TX may be written along the TX path 104 as part of the DATA OUT sequence provided by the SCM 100. Alternatively, an optional output 124_OO is provided from the TX CRC generation block 124, through which the CRC_TX may pass directly to the TX FIFO 122, for example as may be triggered if the TX FIFO 122 becomes empty, as indicated by a separate optional FIFO empty signal 122_OFE (which may be provided, for example, as a function of the FIFO address pointer). Lastly in regard to the path for DATA OUT from the SCM 100, the output of the TX FIFO 122 is coupled to a TX serial register (SR) 126. The TX SR 126 operates to shift data, for example one bit at a time, from an indicated storage location in the TX FIFO 122, and cumulatively as a serial data stream forming DATA OUT and thereby providing a serial port out from the SCM 100. Accordingly, and as detailed below, the DATA OUT stream will include, in general sequential order, first a sequence of communication data bits, previously provided from the bus I/F 110 and potentially reduced to N bits by the TX data correction block 118, followed by the CRC_TX, that is, a sequence of bits corresponding to the CRC value for the sequence of communication data bits.

The RX path 106 includes various aspects for receiving a data sequence and an RX CRC value corresponding to the data sequence, generally in reverse fashion to the TX path 104. Looking from right to left in FIG. 1 at the RX path 106, an M-bit RX SR 128 receives a DATA IN sequence from a source external from the SCM 100, for example one bit at a time, and thereby providing a serial port in to the SCM 100. The RX SR 128 shifts and outputs a set of received bits to a selected (e.g., by a RX FIFO pointer) storage location in an RX FIFO 130, to which the RX SR 128 is coupled. The RX FIFO 130 is sized to have M-bit wide storage locations, based on similar considerations to the TX FIFO 122. The output of the RX FIFO 130 is coupled to an input of an RX data correction block 132. The RX data correction block 132 has a data size D_S_RX control input, which also may be provided as a control input to the CRC controller 108. As detailed below, the value indicated by D_S_RX indicates a number of bits in a received data unit that are expected to be valid, and if that number does not indicate a standardized size (e.g., 8 bits or 16 bits), then in response the RX data correction block 132 will correct the total number of bits to add a zero in each MSB position that is not indicated as valid by the size indicated by D_S_RX. For example, if D_S_RX=5, then the RX data correction block 132 zero pads the 3 MSBs beyond the 5 valid bits, thereby producing a standardized size of 8 bits, with zeroes as the 3 MSBs. Similarly, if D_S_RX=14 then the RX data correction block 132 zero pads the 2 MSBs beyond the 14 valid bits, thereby producing a standardized size of 16 bits, with zeroes as the 2 MSBs. The output of the RX data correction block 132 is coupled to an RX DATA register 134 and an RX CRC generation block 136. The RX DATA register 134 is sized similar to the TX DATA register 118 (e.g., 16 bits), and the output of the RX DATA register 134 is coupled, for example to provide a multi-bit output, to the bus I/F 110, so that once (potentially corrected) data is stored in the RX DATA register 134, it may be read via the bus I/F 110. The RX CRC generation block 136 is bidirectionally coupled to the bus I/F 110, allowing data and control to be exchanged between the two. For example, the RX CRC generation block 136 can be enabled from the bus I/F 110, for example under signaling of an enabling control signal RX_CRC_EN from the CPU, and the bus I/F 110 can read a CRC value, to be used as a comparison CRC value indicated as CRC_C, generated by the RX CRC generation block 136. The RX CRC generation block 136 has a CRC polynomial select control (RX_CRC_POLY_S), in response to which the CRC generation block 136 selects the size of the appropriate CRC polynomial to use in connection with data received from the RX data correction block 132, and using that polynomial with the received data, the RX CRC generation block 132 generates CRC_C. Again by example, RX_CRC_POLY_S may be a 1-bit control, indicating in a first binary state a selection of an 8-bit polynomial and in a second binary state a selection of a 16-bit polynomial. Further, comparable to the TX CRC Generation block 124, the RX CRC generation block 136 also includes a state register 136_STR and an auto-seed generator 136_ASG, such that when the state register 136_STR is written or read, and provided the RTX CRC generation block 136 does not already have a CRC seed available for CRC determination, then the auto-seed generator 136_ASG provides a seed in response to the state register 136_STR write/read. The RX CRC generation block 136 is coupled to the bus I/F 110, so that once the CRC_C is determined, the RX CRC generation block 136 may be read via the bus I/F 110.

Figure 2:
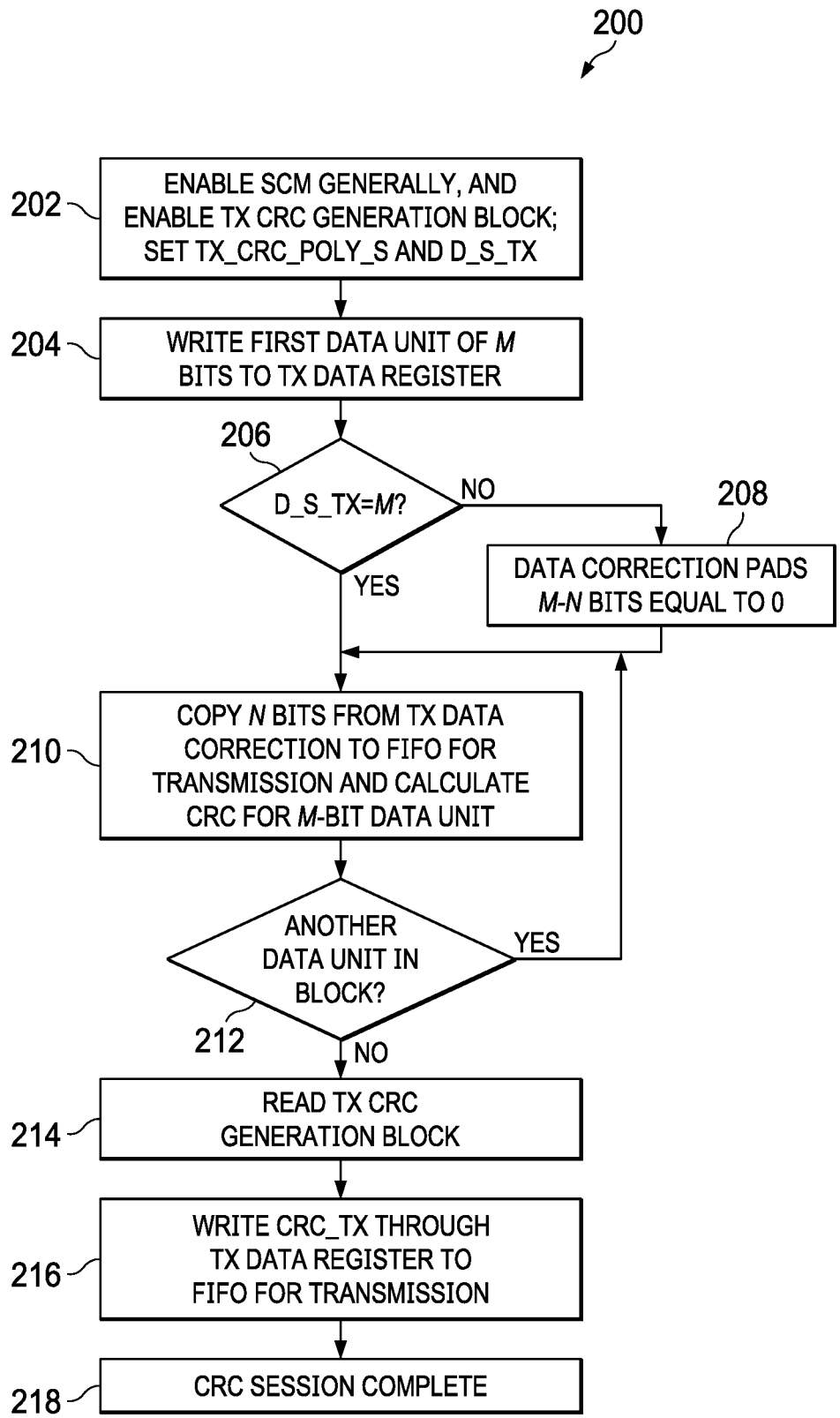
FIG. 2 is a flowchart of a CRC method that operates the FIG. 1 SCM to transmit data and a corresponding CRC.

FIG. 2 is a flowchart of a CRC method 200 that operates the SCM 100 to transmit data, and the determined CRC_TX corresponding to that data, based on access through the bus I/F 110 for example under CPU-executed software (or DMA process). Use of a flowchart for this method, or others in this document, is by way of example, as certain steps may be achieved in other (or overlapping) orders or through other mechanisms, for example via a state machine that implements part of the CRC controller 108 as well as other hardware in the SCM 100. The method 200 commences with a step 202, in which the SCM 100 is enabled generally by asserting C_ENABLE for module communications to DATA OUT (and closing the switch 120), and separately TX_CRC_EN is asserted and thereby enables the TX CRC generation block 124. The TX_CRC_EN assertion may be achieved, for example, by the CPU through the bus I/F 110, which can assert TX_CRC_EN or some other enabling control signal to the TX CRC generation block 124 (or to some control register somewhere in the SCM 100 for this purpose). When the TX CRC generation block 124 is so enabled, which also may set a bit in the state register 124_STR to indicate the enablement, its auto-seed generator 124_ASG automatically provides a CRC seed, as introduced above, and at a size indicated by TX_CRC_POLY_S. Accordingly, an external source need not provide the seed, but only the enablement of the TX CRC generation block 124. Further, enablement of the TX CRC generation block 124 precedes a session during which: (i) a data block is transmitted through the SCM 100; (ii) the CRC_TX corresponding to the data block is determined; and (iii) both the data block and the corresponding CRC_TX are transmitted as DATA OUT. Accordingly, enabling the CRC controller 108 causes the switch 120 to close, so that subsequent data during the session is communicated to the TX FIFO 122 and beyond; conversely and as further discussed below, if the CRC controller 108 is not so enabled, then other portions of the SCM 100 also may still be used for CRC generation and consideration of other types of information, but for which there is not a goal of transmitting that data as DATA OUT from the SCM 100. Also in the step 202, the control signals D_S_TX and TX_CRC_POLY_S are initialized for the upcoming session, so as to adjust data and CRC polynomial size, respectively. Next, the method 200 continues to a step 204.

The step 204 writes through the bus I/F 110 a first set of data, having M bits and referred to herein as a data unit, to the TX data register 116, as may be written under control of a CPU or by DMA. For an enabled CRC session, the data unit may be a single unit or may be followed by one or more units, either singularly or collectively forming a data block for which the CRC_TX is ultimately generated and transmitted by the SCM 100, following the transmission of the data block. Once the M-bit data unit reaches or is stored in the TX data register 116, it also passes to the TX data correction block 118. Next, the method 200 continues to a step 206.

The step 206 is a conditional check which, in combination with a step 208, may selectively zero-out a number of most significant bits of the M bits before CRC value calculation. Specifically, the step 206 evaluates whether the number N of bits indicated by D_S_TX, and accordingly as desired for subsequent transmission, are the same as the number of bits, M, received from the TX data register 116. If N≠M, the method 200 continues from the step 206 to a step 208, whereas if the N=M, the method 200 continues from the step 206 to a step 210. In step 208, because N≠M, then the step 208 pads (changes) to zeroes the most significant M−N bits in the data. For example, if the CPU writes an M=16 bit data unit 0x7123, but if D_S_TX selects N=12 bits, then the step 208 zeroes the most significant 16-12=4 bits to convert the value of 0x7123 to 0x0123 for purposes of CRC value determination. Next, the method 200 proceeds from the step 208 to the step 210.

The step 210 copies the N bits of data from the first data unit and provided by the TX data correction block 118 through the closed switch 120, to the TX FIFO 122. Using the preceding example of N=12 and for a data unit of 0x7123, then the value 0x123 is provided to the TX FIFO 122. In an example, however, the data passage additionally triggers the TX CRC generation block 124 to determine the CRC_TX, based on the same data unit, but also as potentially altered by the step 208 to include M−N zeroed MSBs in the total M-bit data unit, and also further given the step 202 auto-seed. Again in the prior example for N=12 and for a data unit of 0x7123, then the zeroed alteration of 0x0123 is used as the data unit for determining the CRC_TX. The determined CRC_TX may be stored temporarily by the TX CRC generation block 124. Accordingly, in the example implementation, the CPU/DMA can provide a nominally-sized data unit with M bits, whereas other hardware can determine the number of the Mbits used for determining the CRC value; further, in an example circuit, only the N-specified bits are transmitted as part of the DATA OUT, so in the example above, while the value 0x0123 is used for purposes of CRC determination, the lesser number of N=12 bits (0x123) are transmitted onward as the current data unit, without burdening the CPU/DMA to reduce the data unit from M to N bits. Additionally, once a data unit arrives in the TX FIFO 122, the FIFO control begins transmission of that data unit, and any unit that follows it, until the TX FIFO 122 is emptied. As shown in FIG. 1, such transmission is through the TX SR register 126, which may for a given FIFO location shift out the data, one bit at a time, to the output shown as DATA OUT. Next, the method 200 proceeds from the step 210 to a step 212.

The step 212 is a conditional check that evaluates whether there are any more data unit(s) in the data block for the current session. If there is such a data unit(s), then the method 200 returns from the step 212 back to the step 210, and if there is not, then the method 200 continues from the step 212 to a step 214. If a return to the step 210 occurs, it should be understood to occur in conjunction with a next data unit in the data block for the same session. Accordingly, that next data unit will have the same number of N bits as the session data unit(s) preceding it, so when the N bits of the next data unit are received into the TX data correction block 118, and to the extent that M>N, then the additional M−N MSBs are again padded with zeroes at which point the step 210 repeats, but with respect to an N-bit data unit or units after the first data unit in the session. For example, after a first data unit in a data block is processed, and if control returns to the step 210, then the CRC_TX is further determined in view of a next data unit copied from the TX data correction block 118, potentially altered by padding to include M−N zeroed MSBs, while the N-bits of that data unit are copied through the closed switch 120, to the TX FIFO 122, from where it will be copied to the TX SR register 126 and then shifted out, one bit at a time, to the output shown as DATA OUT. Eventually, when all data units in the data block are likewise processed, the method 200 proceeds to the step 214.

The step 214 reads the completed CRC_TX for the data block of the current session. In an example, the read is via the bus IF 110, so that the CRC_TX is accessible via the first bus 112. Such an approach may be desirable, for example, where the SCM 100 is to communicate the CRC_TX, but has particular timing considerations for when the CRC_TX is to then pass as part of the DATA OUT—such timing considerations could include the possibility of intermittent transfers of data during a session, in which case the TX FIFO 122 may become empty before all data from the session is output, so the CRC_TX read and transfer may be timed not simply based on the FIFO status, but also under control of the CPU or DMA. Accordingly, in a following step 216, and under control (including desirable timing) of the CPU or DMA, the CRC_TX can be transferred to the TX data register 116, the TX data correction block 118, and the TX FIFO 122. As the information is then emptied from the TX FIFO 122 through the TX SR 126, the last of that information will provide the CRC_TX, as part of the DATA OUT. Next, the method 200 continues a step 218, indicating the CRC process is complete for the current session. While not shown, the method 200 may thereafter re-instantiate, for a different data block and a CRC_TX to be generated for that block.

Figure 3:
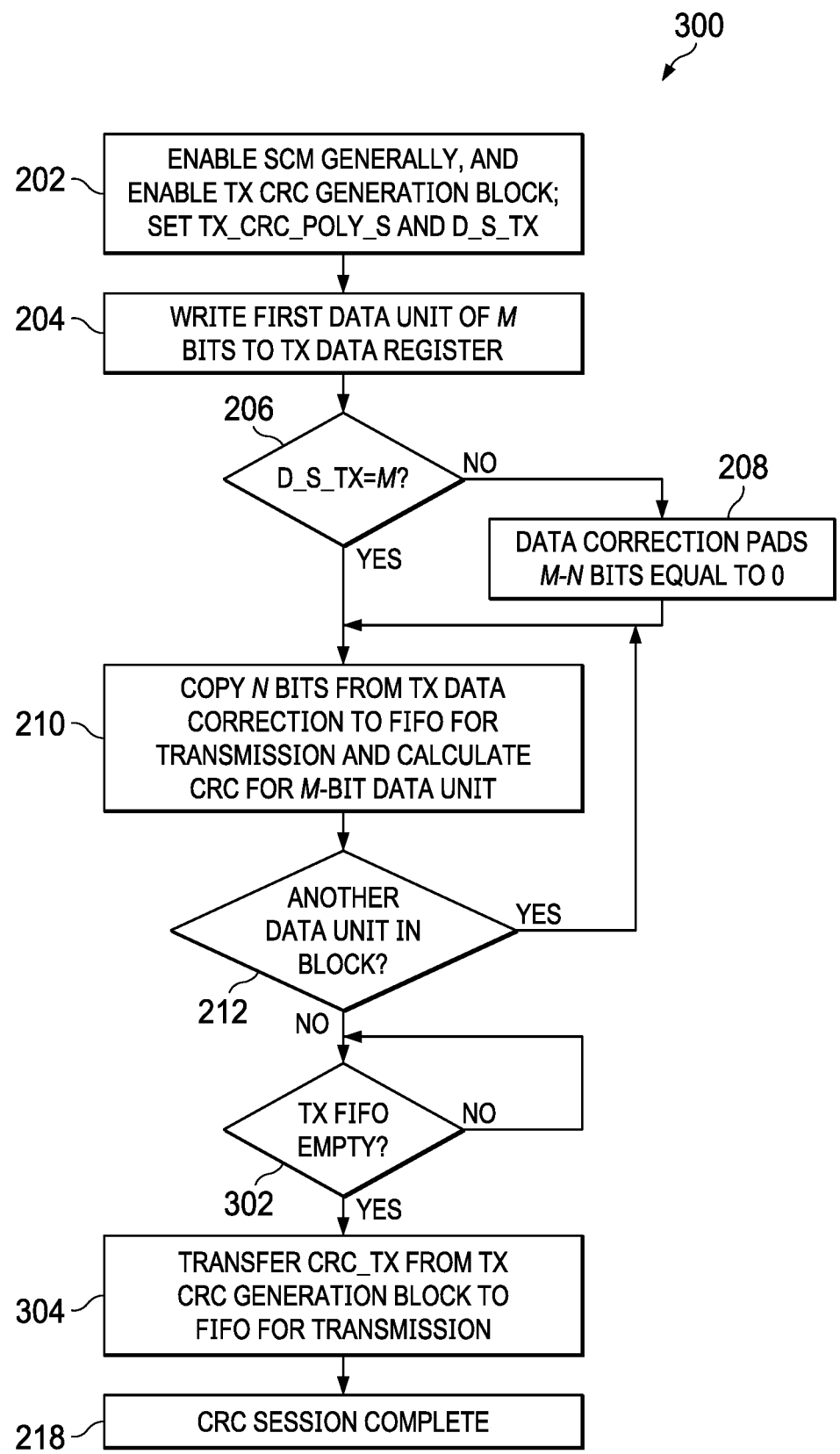
FIG. 3 is a flowchart of a CRC method with the final transmission of a CRC achievable without CPU (or other software) intervention, for example by additional SCM hardware.

FIG. 3 is a flowchart of a CRC method 300 illustrating the operational steps of the SCM 100, with the final transmission of the CRC_TX achievable without CPU (or other software) intervention, for example by additional hardware in the SCM 100. The method 300 includes the same steps 202 through 212 (and 218) of the FIG. 2 method 200, so the reader is referred above for additional details. The method 300 differs from the method 200 in the result following the conditional step 212, which recall evaluates whether there is any more data unit(s) in the data block for the current session. Once there is no such additional data unit(s), the method 300 continues to a step 302. The step 302 is an additional conditional check to determine whether the TX FIFO 122 is empty after the start of a CRC session, as may be accomplished in the SCM 100 for example with respect to the TX FIFO address pointer. If the TX FIFO 122 is not empty, then the method 300 remains in the step 302, for example as a return to same state in a state machine that implements the sequence of the method 300. Once the TX FIFO 122 is empty (e.g., TX FIFO address pointer points to its first entry position), the method 300 continues to a step 304.

The step 304 transfers the session CRC_TX from the CRC generation block 124 to the TX FIFO 122, for example without (or in addition to) making the CRC_TX available to the first bus 112 (or the second bus 114). For example, recall the SCM 100 may include the optional output 124_00 from the TX CRC generation block 124 to the TX FIFO 122. With this coupling, once the TX FIFO 122 becomes empty, it is expected that the data unit(s) for the data block of the current CRC session have fully passed through the SCM 100, so all that remains to be transmitted in connection with that data block is its CRC_TX. Further, with all data unit(s) having been written and as detailed below, the CRC_TX is already determined in a same cycle, so it is readily stored and available for transfer to the TX FIFO 122. As was the case for method 200, once the CRC_TX reaches the TX FIFO 122, it passes via the TX SR register 126 as the final part of the DATA OUT for the current CRC session. Thereafter, the method 300 continues to the step 218, which as described above relative to FIG. 2, completes the current CRC session.

Figure 4:
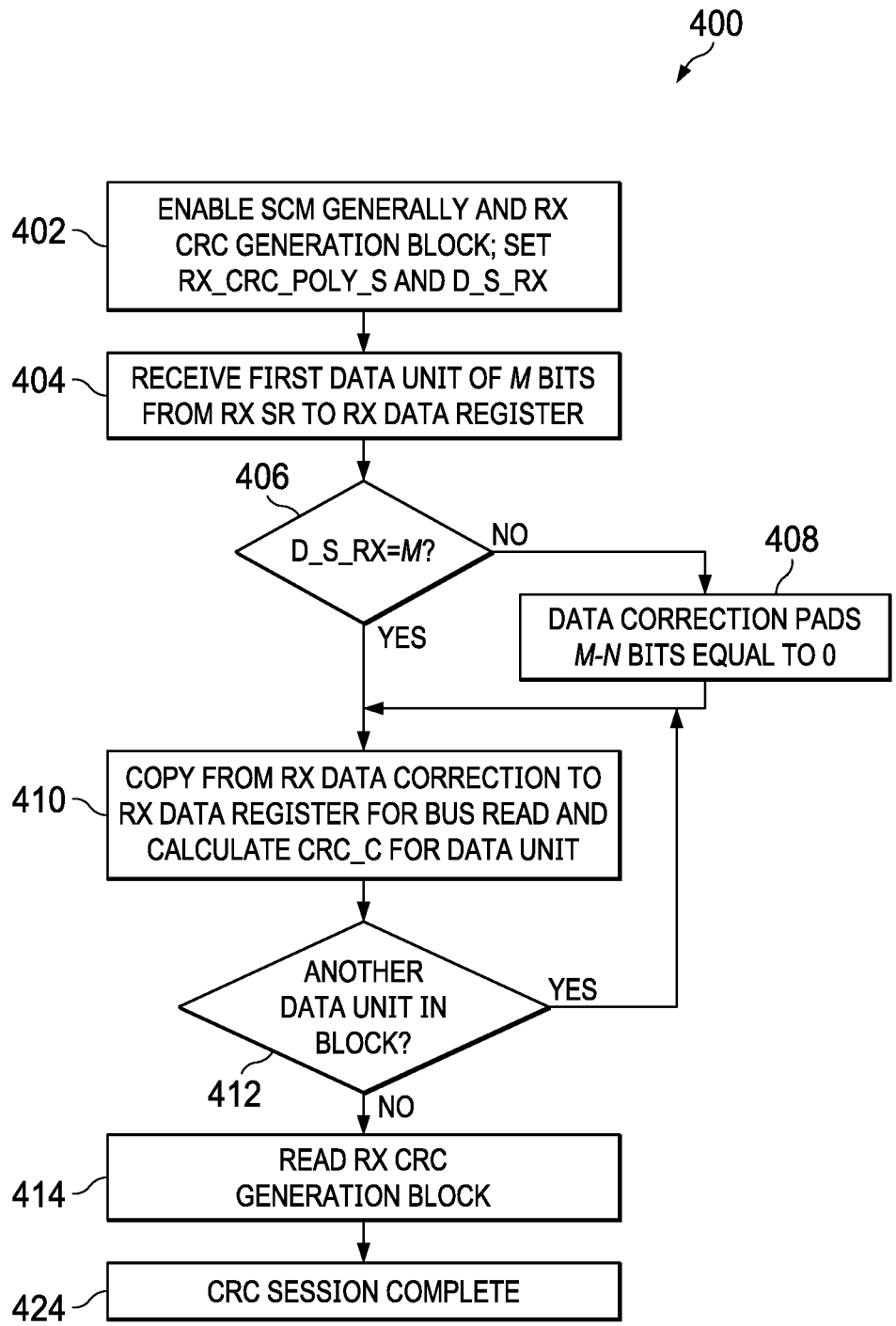
FIG. 4 is a flowchart of a CRC method 400 to receive data and a corresponding transmitted CRC, as to generate a second CRC based on the received data.

FIG. 4 is a flowchart of a CRC method 400 that operates the SCM 100 to receive data and a corresponding transmitted CRC, and to generate its own comparison CRC_C, based on the received data. Inasmuch as the FIG. 1 RX path 106 mostly mirrors, in reverse order, the TX path 104, then comparably the FIG. 4 method 400 pertaining to data receipt mirrors the FIG. 2 method 200 pertaining to data transmission.

The method 400 commences with a step 402, in which the SCM 100 is enabled generally by asserting C_ENABLE for module communications received as DATA IN and the RX CRC generation block 136 enabled, for example by the CPU asserting RX_CRC_EN through the bus I/F 110, to the RX CRC generation block 136 (or to some control register somewhere in the SCM 100 for this purpose). Enablement of the RX CRC generation block 136 precedes a session during which a data block and a corresponding received CRC value are both received as DATA IN through the SCM 100, the comparison CRC_C corresponding to the data block is determined, and the data block and both CRC values are available to be read through the bus I/F 110. Also in the step 402, the control signals D_S_RX and RX_CRC_POLY_S are initialized for the upcoming session, so as to adjust data and CRC polynomial size, respectively. Next, the method 400 continues to a step 404.

The step 404 receives into an A-bit location of the RX FIFO 130, from the RX SR 128, a sequence of N bits as a data unit, where N may or may not equal M. For a receive session and prior to the step 404, the actual number of bits in a data unit (N-bits) and data size for CRC calculation (A-bits), as well as the total number of data units to be received, are all mutually agreed between external host and the receiver. The N bits provide a first received data unit of a data block, having one or more data units, and that will be followed by a CRC value corresponding to that data block. Recall, however, that the RX SR 128 and each location in the RX FIFO 130 are M-bits wide, so as an N-bit data unit is received, it is shifted into the RX SR 128, which then writes a total of M bits into an indicated location in the RX FIFO 130, where at this time the most significant M-N bits are "don't cares" or otherwise necessarily invalid, as only an N-bit value was received. Likewise, the RX FIFO 130 then outputs that M-bit data unit, which includes the N-bit data unit received as DATA IN. The RX FIFO 130, under its own control, also then provides the Mbits, which include the received N bit data unit, to the RX data correction block 132, and as detailed below the RX FIFO 130 can receive additional bits, either as more data units in the same data block, or as the CRC for that data block. Next, the method 400 continues to a step 406.

The step 406, and the potential conditionally-reached step 408 after it, provide reverse operations relative to the FIG. 2 steps 206 and 208. Recall those earlier steps permit indication to transmit N-bits of an M-bit data unit, and relatedly a CRC value determination for the A-bit data unit, with potentially M-N of its MSBs having been zeroed. In opposite fashion with respect to receiving data, the SCM 100 may receive data from a separate device, such as another device having the same architecture as the SCM 100, which also has transmitted a comparable processed data unit, namely, having N bits derived from a larger M-bit data unit (and the corresponding CRC value). The step 406 accommodates such a possibility by providing a conditional check which, in combination with the step 408, may selectively alter the data unit from a size indicated by D_S_RX up to an M-bit format with M-N zeroed MSBs, before the CRC_C calculation and before providing the data unit to the bus I/F 110. In this regard, the step 406 determines whether the number N indicated by D_S_RX, of received bits from the RX FIFO 130, is the same as the number M of bits. In this regard, in one example, the acceptable values for M are expected to align with the nominal (or standard) values to be processed by the CPU, for example with M as either 8 or 16. If N M, the method 400 continues from the step 406 to the step 408, whereas if N=M, the method 400 continues from the step 406 to a step 410. In step 408, because N≠M, then the step 408 pads (adds) zeroes for the most significant M-N bits in the data, thereby converting a received non-standard sized data unit (having N bits other than 8 bits or 16 bits) to the M-bit size. Generally, then, if N is less than 8 bits (such as 4 to 7 bits), the data unit can be zero-padded to M=8 bits, and if N is from 9 to 15 bits, the data unit can be zero-padded to M=16 bits. For example, if the DATA IN is an N=12 bit data unit 0x123, then the step 408 adds zeroes as the most significant 16-12=4 bits to convert the value of 0x123 to 0x0123, after which the method 400 proceeds from the step 408 to the step 410.

The step 410 copies the data, namely the first received data unit from the RX data correction block 132 (potentially adjusted by the step 408 from N to M bits) to the RX data register 134. In an example, the passage of the received data is also to the RX CRC generation block 136, which using the earlier step 402 auto-generated seed determines CRC_C for the step 410 passed data unit, and the determined CRC_C may be stored temporarily by the RX CRC generation block 136. Next, the method 400 proceeds from the step 410 to a step 412.

The step 412 is a conditional check that evaluates whether there is any more data unit(s) in the data block for the current session. In an example, the size of the receive data block, that is the total number of data units, will be communicated (e.g., embedded into message header sent) by the external host which the software on the receive SCM 100 will interpret, so that after those many data units are received, the next received data unit is considered as the CRC value. This implementation may occur in the software data link layer. Accordingly, in the step 412, if there is any remaining data unit(s) in the data block, then the method 400 returns from the step 412 back to the step 410, and if there is not, then the method 400 continues from the step 412 to a step 414. If there is a return to the step 410, then the step 410 repeats, but with respect to a data unit or units after the first data unit in the session. Here, as was explained regarding a repeat of the step 210 in FIG. 2, for a step 410 repeat the next data unit will have the same number of N bits as the session data unit(s) preceding it, so when the N bits of the next data unit are received into the RX data correction block 132, and to the extent that M>N, then the additional M-N MSBs are again padded with zeroes at which point the step 410 repeats, but with respect to an N-bit data unit or units after the first data unit in the session. For example, after a first data unit in a data block is processed and if control returns to the step 410, then a next data unit is copied from the RX data correction block 132 to the RX data register 134 (with potentially zero-padded MSB(s), based on whether M>N), and it also is copied to the RX CRC generation block 136 at which point the CRC_C is again determined. Eventually, when all data units in the data block are processed, the method 400 proceeds to the step 414.

The step 414 indicates a read of the completed CRC_C, from the RX CRC generation block 136, for the data block of the current session. In an example, the read is via the bus I/F 110, so that the CRC_C is accessible via the first bus 112. Accordingly, the step 414 read can be instigated, for example, by the CPU or DMA, or any other control having read access and privilege to the appropriate bus. To check data integrity, the determined and then read CRC_C also may be compared, for example, against the CRC value received at the end of the data block in the current session, although FIG. 4 does not explicitly illustrate this step as it may be implemented apart from the SCM 100, for example in connection with the CPU that reads the CRC_C. Appropriate response also may be implemented, depending on whether the CRC comparison is a match or mismatch. Next, the method 400 continues a step 424, indicating the CRC process is complete for the current session. While not shown, the method 400 may thereafter re-instantiate, for a different received data block and a CRC value to be generated for that block.

Given the preceding, the example SCM 100 provides one or both of a TX and RX path 104 and 106, either of which includes hardware and functionality to accomplish CRC generation, namely the TX CRC generation block 124 in the TX path 104, or the RX CRC generation block 136 in the RX path 106. In an example, the hardware for either or both of the TX CRC generation block 124 or the RX CRC generation block 136 may be implemented in XOR gate blocks (or sub-blocks) that generate a CRC value for either a first data size, such as 8-bit data using one of two polynomials, such as either an 8-bit or 16-bit polynomial, or for a second data size, such as 16-bit data, using the second polynomial, which in the example shown is a 16-bit polynomial. Smaller data sizes also are accommodated, by adjusting them (such as with hardware providing zero padding) for processing by either an 8-bit or 16-bit polynomial. In an example, the totality of these options is implemented with a first CRC sub-block implementing a collective 8-bit data input by 8-bit polynomial CRC determination in a single cycle, and a second CRC sub-block implementing a collective 8-bit data input by 16-bit polynomial CRC determination, which can support either a single 8-bit data by 16-bit polynomial CRC determination in a single cycle, or a 16-bit data by 16-bit polynomial CRC determination in two cycles, with a first cycle corresponding to a first 8 bits (such as the 8 MSBs) in the 16-bit data and a second cycle corresponding to a second 8 bits (such as the 8 LSBs) in the 16-bit data. In this regard, various alternative CRC value determinations may be made, including a 16-bit data by 16-bit polynomial, without dedicated hardware with a 16-bit data input. As detailed below, such an approach also may be implemented such that the latency of CRC value generation adds no net resource burden, by implementing the SCM with a bus protocol that specifies an adequate enable and access time. Further in such an approach, the various determinations are supported, including 16-bit data by 16-bit polynomial, without implementing a hardware system block that in a single cycle determines 16-bit data by 16-bit polynomial CRC values; such a hardware system would be anticipated to require a considerably larger amount of hardware, such as twice the hardware, and corresponding increased complexity and power, as compared to the example in which 16-bit data by 16-bit polynomial CRC determination is provided in two cycles, by 8-bit data by 16-bit polynomial hardware.

Figure 5:
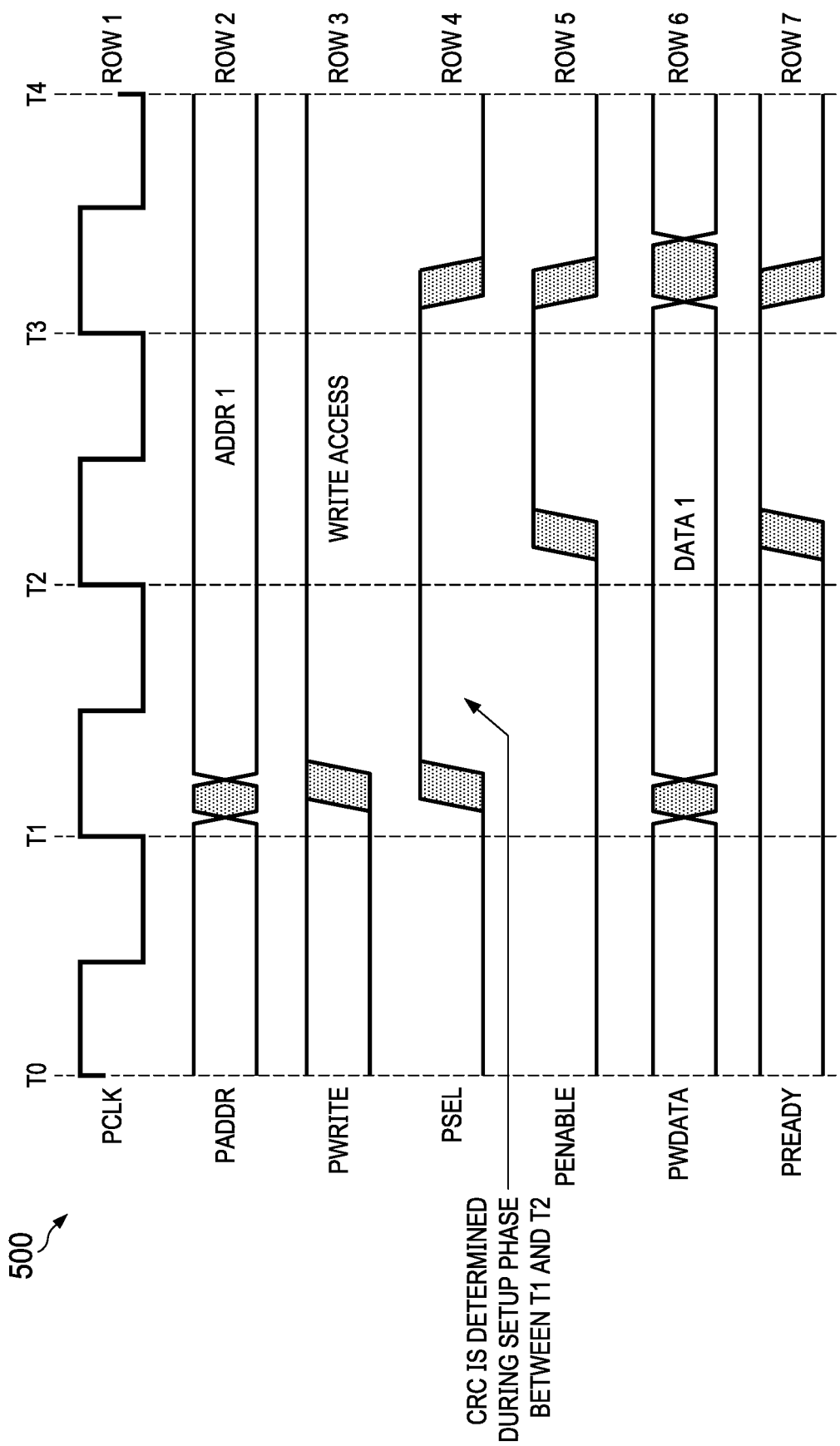
FIG. 5 illustrates a timing diagram of bus signals for an 8-bit CRC determination.

FIG. 5 illustrates a timing diagram 500 of seven bus signals, shown respectively in ROW 1 through ROW 7, in connection with an example protocol, namely, the Advanced Microcontroller Bus Architecture (AMBA) Advanced Peripheral Bus (APB) Protocol 2.0 Specification, and further in connection with an 8-bit CRC value determination of the SCM 100. For example, consider the timing diagram 500 in connection with the FIG. 2 step 210, where the CRC_TX is generated corresponding to a data unit being transmitted along the TX path 104, and ultimately that CRC_TX is provided as DATA OUT. Generally, in AMBA APB2.0, a write (or read) operation takes two clock cycles, a first clock cycle for a setup phase and a second clock cycle for an access phase (assuming no wait states). In the example SCM 100, CRC generation and availability for write (or read) is concurrent with this two-phase specification, thereby availing of the ability to provide either an 8-bit or 16-bit CRC value generation without additional latency beyond the nominal clock cycles used for read/write, as further described below.

In FIG. 5, the setup phase occurs in the clock cycle between the high transitions at T1 and T2, during which PSEL=1 as shown in ROW 4. Also during this time, PWRITE=1, indicating the access to the internal bus will be for a write, for example of a data unit for which a CRC value is to be determined. Accordingly for an 8-bit data unit, those 8 bits can be written during the setup phase, as shown in ROW 6 as Data 1 appears slightly after the rise in T1 and at least by the time T2. Further, once the Data 1 appears after T1, the 8-bit data unit is loaded into the TX CRC generation block 124 which determines the CRC_TX, using either an 8-bit (CRC sub-block 124_SB1) or 16-bit (CRC sub-block 124_SB2) polynomial, also during the setup phase and before T2. As indicated earlier, if the current written data unit is the last in the data block, then the CRC_TX for 8-bit data is thusly immediately available for transfer from the TX CRC generation block 124 in a next cycle.

Figure 6:
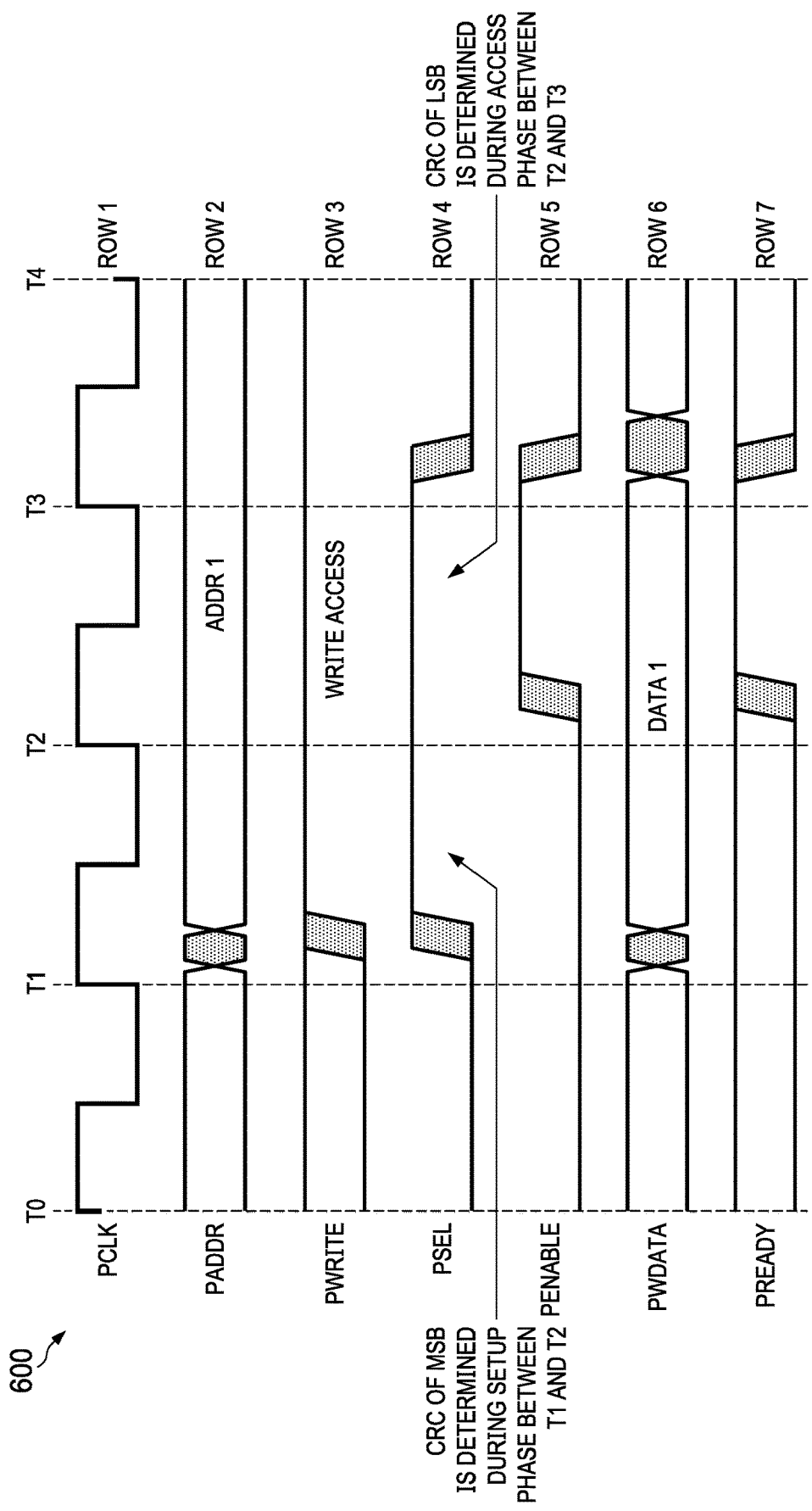
FIG. 6 illustrates a timing diagram of bus signals for a 16-bit CRC determination.

FIG. 6 illustrates a timing diagram 600 in which the signals are the same as the FIG. 5 timing diagram 500, but includes alternative indications of the timing for generation of a CRC value in the SCM 100 for 16-bit data with a 16-bit polynomial, and consistent with the timing of AMBA APB 2.0. Again, the setup phase occurs in the clock cycle between the high transition of T1 and T2, with PSEL=1. In that clock cycle and based on the PSEL=1 condition, the SCM 100 writes the 8 MSBs of a 16-bit data unit, and at the same time loads those 8 MSBs into the TX CRC generation block 124 (CRC sub-block 124_SB2) and generates a first portion of the CRC_TX using a 16-bit polynomial. In the next successive clock cycle, detectable when PSEL=1 and PENABLE=1, the SCM 100 writes the 8 LSBs of the 16-bit data, and at the same time loads those 8 LSBs into the TX CRC generation block 124 (again, CRC sub-block 124_SB2) and generates a second portion of the CRC_TX using the 16-bit polynomial. Accordingly, by the completion of that second clock cycle (the access cycle), both the first and second portions of the CRC_TX are determined. Accordingly, if the current written data unit is the last in the data block, then the CRC_TX for 16-bit data is thusly immediately available for transfer from the TX CRC generation block 124 in a next cycle.

Having described FIGS. 5 and 6 regarding the CRC generation of the TX path 104, comparable timing applies in the RX path 106. Particularly, a data unit is internally read from the RX FIFO 130 to the RX data register 134 according to the same two clock protocol, including a setup clock cycle followed by an access clock cycle. When an 8-bit data unit is read, the read may be completed in a single clock cycle, and when a 16-bit data unit is read, the read is across both the setup and access clock cycle, with one 8-bit portion read per cycle. Meanwhile, during these two-cycle reads, the data is also accessible by the RX CRC generation block 136, which can concurrently determine an 8-bit data by 8-bit polynomial CRC_C via the CRC sub-block 136_SB1 (or 16-bit polynomial via the CRC sub-block 136_SB2) during the first of the two clock cycles, or a 16-bit data by 16-bit polynomial CRC_C during across both of the two clock cycles (determining a first 8-bit by 16-bit polynomial in the setup clock cycle, and a second 8-bit by 16-bit polynomial in the access clock cycle, both via the CRC sub-block 136_SB2). Accordingly, when the last data unit is internally read into the RX data register 134, then the CRC_C for either 8-bit or 16-bit data is thusly immediately available for transfer from the RX CRC generation block 136 in a next cycle.

From the above, examples include serial communications modules with flexible and efficient CRC structure and functionality with one or more of the following benefits. The functionality may be enabled for serial communications with the module. The CRC transmit side may be disabled from transmitting the CRC value to the TX path 104 (such as by disabling a path to the TX FIFO 122 by opening the switch 120), while the CRC block remains otherwise usable or repurposed via the bus I/F 110, for general purpose software that can use CRC. Such usage may include, for example, checking the trim data or application code integrity at the time of device boot or general purpose usage by application software during execution. The example SCM is area efficient and can determine CRC without additional latency, relative to certain protocols, such as those implementing two clock cycles for read/write operations. Data size adjustment may be implemented with internal hardware, easing software development. CRC seeding can be automatically triggered when the SCM is enabled or by a state write to, or read from, a register, without the total seed value being provided from a bus controller (such as CPU or DMA). Finally, the SCM may be implemented on different types of serial communication modules, such as SPI, UART, I2C, one or more of which can be implemented in a same integrated circuit. Finally, additional modifications are possible in the described examples, and other examples are possible, within the scope of the following claims.

What is claimed is:

1. An electronic circuit comprising:
   an interface;
   a transmit data register coupled to the interface;
   a first storage device coupled to the transmit data register and including a plurality of storage locations, each storage location adapted to store a data unit;
   a first serial register coupled between the first storage device and a first output; and
   a first cyclic redundancy check (CRC) generation circuit having an input coupled to a first intermediate node that is coupled between an output of the transmit data register and the first storage device, wherein the first CRC generation circuit comprises:
      a first CRC generation block configured to provide a first CRC in response to an X-bit data unit and an X-bit polynomial, wherein X is a positive integer greater than 0; and
      a second CRC generation block with a collective X-bit input for providing a second CRC in response to an X-bit data unit and a 2X-bit polynomial in a single clock cycle of a clock signal and a 2X-bit data unit and a 2X-bit polynomial in two clock cycles of the clock signal.

2. The electronic circuit of claim 1, further comprising a CRC seed auto-generator configured to provide a CRC seed to the first CRC generation circuit.

3. The electronic circuit of claim 2, wherein the CRC seed auto-generator is configured to provide the CRC seed to the first CRC generation circuit in response to a read or write to a state register.

4. The electronic circuit of claim 1, further comprising a switch coupled between the transmit data register and the first storage device.

5. The electronic circuit of claim 1, further comprising a transmit data correction circuit coupled between the transmit data register and the first storage device.

6. The electronic circuit of claim 5, further comprising a switch coupled between the transmit data correction circuit and the first storage device.

7. The electronic circuit of claim 1, further comprising a coupling between the first CRC generation circuit and the first storage device.

8. The electronic circuit of claim 7, further comprising a circuit for causing a CRC generated by the first CRC generation circuit to forward along the coupling in response to the first storage device reaching an empty status.

9. The electronic circuit of claim 1, further comprising a coupling between the first CRC generation circuit and the interface.

10. The electronic circuit of claim 1, wherein the second CRC generation block is configured to provide a first portion of the CRC in response to a first X bits of the 2X-bit data unit in a first of the two clock cycles and a second portion of the CRC in response to a second X bits of the 2X-bit data unit in a second of the two clock cycles.

11. The electronic circuit of claim 1, wherein the interface, transmit data register, first storage device, first serial register, and first CRC generation circuit form part of a serial communication module, wherein the first output is an output of the serial communication module.

12. The electronic circuit of claim 11, wherein the serial communication module comprises a serial peripheral interface (SPI) module, an inter-integrated circuit (I2C) module, or a universal asynchronous receiver-transmitter (UART) module.

13. The electronic circuit of claim 1, wherein the first storage device is a first-in-first-out (FIFO) storage device.

14. The electronic circuit of claim 1, further comprising:
   a second serial register coupled to a first input;
   a second storage device coupled to the second serial register and including a plurality of storage locations, each storage location adapted to store a data unit;
   a receive data register coupled between the second storage device and the interface; and
   a second CRC generation circuit having an input coupled to a second intermediate node that is coupled between an output of the receive data register and the second storage device, wherein the second CRC generation circuit comprises:
      a third CRC generation block configured to provide a CRC in response to an X-bit data unit and an X-bit polynomial; and
      a fourth CRC generation block with a collective X-bit input for providing a CRC in response to an X-bit data unit and a 2X-bit polynomial in a single clock cycle of the clock signal and a 2X-bit data unit and a 2X-bit polynomial in two clock cycles of the clock signal.

15. The electronic circuit of claim 1, wherein the transmit data register is configured to receive multi-bit input data from the interface.

16. The electronic circuit of claim 1, further comprising a transmit data path that includes the transmit data register, the first storage device, and the first output, wherein the first CRC generation circuit is configured to provide a CRC in response to a data unit on the data transmit path, the transmit data path further comprising a switch configured to selectively disable transmission of the CRC through the transmit data path.

17. The electronic circuit of claim 16, wherein the transmit data register is sized to a predetermined maximum possible data input size of M bits, wherein the transmit data path further comprises a data correction unit configured to alter a remaining M–N most significant bits of the CRC, wherein N is a positive integer smaller than or equal to M.

18. The electronic circuit of claim 1, wherein M is equal to 16, and N is between 4 and 16, inclusive.

19. The electronic circuit of claim 1, wherein the electronic circuit is integrated in an integrated circuit.

* * * * *